(12) United States Patent
Oh et al.

(10) Patent No.: US 8,330,339 B2
(45) Date of Patent: Dec. 11, 2012

(54) LIGHT EMITTING DISPLAY AND METHOD OF MANUFACTURING THE SAME

(75) Inventors: Min-ho Oh, Yongin (KR); Yoon-Hyeung Cho, Yongin (KR); Byoung-duk Lee, Yongin (KR); So-young Lee, Yongin (KR); Sun-young Lee, Yongin (KR); Won-jong Kim, Yongin (KR); Yong-tak Kim, Yongin (KR); Jin-baek Choi, Yongin (KR); Jong-hyuk Lee, Yongin (KR); Seung-han Lee, Yongin (KR)

(73) Assignee: Samsung Display Co., Ltd., Yongin, Gyeonggi-Do (KR)

(*) Notice: Subject to any disclaimer, the term of this patent is extended or adjusted under 35 U.S.C. 154(b) by 23 days.

(21) Appl. No.: 12/607,863

(22) Filed: Oct. 28, 2009

(65) Prior Publication Data
US 2010/0045181 A1 Feb. 25, 2010

Related U.S. Application Data

(63) Continuation-in-part of application No. 12/215,610, filed on Jun. 27, 2008.

(30) Foreign Application Priority Data

Jun. 28, 2007 (KR) .................. 10-2007-0064293
Oct. 29, 2008 (KR) .................. 10-2008-0106221

(51) Int. Cl.
*H01J 5/16* (2006.01)
*H01J 61/40* (2006.01)
*H01K 1/26* (2006.01)
*H01K 1/30* (2006.01)

(52) U.S. Cl. ......... 313/113; 313/498; 313/506; 313/512
(58) Field of Classification Search .......... 313/498–512, 313/112, 113
See application file for complete search history.

(56) References Cited

U.S. PATENT DOCUMENTS
5,734,225 A 3/1998 Biebuyck et al.
(Continued)

FOREIGN PATENT DOCUMENTS
CN 1798710 4/2004
(Continued)

OTHER PUBLICATIONS
Office Action dated Jun. 1, 2010 of JP Application No. 2007-263288 which claims priority to corresponding KR 10-2007-0064293.
(Continued)

*Primary Examiner* — Anh Mai
*Assistant Examiner* — Kevin Quarterman
(74) *Attorney, Agent, or Firm* — Knobbe, Martens, Olson & Bear, LLP

(57) ABSTRACT

The present invention is to provide an organic light emitting display and a method of manufacturing the same, the light emitting display including: a first substrate on which a plurality of light emitting devices are formed; a second substrate disposed to face the first substrate; a dam member disposed between the first substrate and the second substrate to surround the plurality of light emitting devices; an inorganic sealing material disposed between the first substrate and the second substrate on an outward side of the dam member and attaching the first substrate and the second substrate; and a filling material provided between the first substrate and the second substrate on an inward side of the dam member and formed of at least one inert liquid selected from the group consisting of perfluorocarbon and fluorinert.

12 Claims, 5 Drawing Sheets

U.S. PATENT DOCUMENTS

| | | |
|---|---|---|
| 6,473,148 B1 | 10/2002 | Suh |
| 6,605,826 B2 | 8/2003 | Yamazaki et al. |
| 6,791,660 B1 | 9/2004 | Hayashi et al. |
| 6,878,467 B2 | 4/2005 | Chung et al. |
| 7,109,655 B2 | 9/2006 | Kurihara |
| 7,112,115 B1 | 9/2006 | Yamazaki et al. |
| 7,128,632 B2 | 10/2006 | Nakamura |
| 7,834,550 B2 * | 11/2010 | Lee et al. ............ 313/512 |
| 2001/0048234 A1 | 12/2001 | Liu et al. |
| 2001/0050532 A1 * | 12/2001 | Eida et al. ............ 313/504 |
| 2003/0042852 A1 | 3/2003 | Chen |
| 2003/0122476 A1 | 7/2003 | Wang et al. |
| 2004/0095060 A1 | 5/2004 | Ushifusa et al. |
| 2004/0207314 A1 | 10/2004 | Aitken et al. |
| 2005/0023976 A1 * | 2/2005 | Wang ..................... 313/512 |
| 2005/0040762 A1 | 2/2005 | Kurihara |
| 2005/0110404 A1 * | 5/2005 | Park et al. ............ 313/512 |
| 2005/0260440 A1 * | 11/2005 | Seo et al. ............ 428/690 |
| 2005/0269940 A1 | 12/2005 | Nishikawa et al. |
| 2006/0082298 A1 | 4/2006 | Becken et al. |
| 2006/0202220 A1 | 9/2006 | Hayashi |
| 2007/0052347 A1 | 3/2007 | Kurihara |
| 2007/0170845 A1 | 7/2007 | Choi et al. |
| 2007/0170861 A1 * | 7/2007 | Lee et al. ............ 313/512 |
| 2007/0194710 A1 * | 8/2007 | Song et al. ............ 313/512 |
| 2009/0009046 A1 | 1/2009 | Oh et al. |
| 2009/0102357 A1 | 4/2009 | Koyama |
| 2010/0045177 A1 | 2/2010 | Oh et al. |

FOREIGN PATENT DOCUMENTS

| | | |
|---|---|---|
| DE | 102005044523 | 3/2007 |
| GB | 2 383 683 | 7/2003 |
| JP | 11-195484 | 7/1999 |
| JP | 2000-068050 | 3/2000 |
| JP | 2002-158088 | 5/2002 |
| JP | 2002-280169 | 9/2002 |
| JP | 2003-203763 | 7/2003 |
| JP | 2003-217830 | 7/2003 |
| JP | 2004-027404 | 1/2004 |
| JP | 2004-095416 | 3/2004 |
| JP | 2005-019300 | 1/2005 |
| JP | 2005-285573 | 10/2005 |
| JP | 2006-156150 | 6/2006 |
| JP | 2006-221906 | 8/2006 |
| JP | 2006-236726 | 9/2006 |
| JP | 2006-252885 | 9/2006 |
| JP | 2007-140061 | 6/2007 |
| JP | 2007-200845 | 8/2007 |
| KR | 1020030024996 | 3/2003 |
| KR | 1020030057053 | 7/2003 |
| KR | 1020050112318 | 11/2005 |
| KR | 1020060021379 | 3/2006 |
| KR | 100671647 | 1/2007 |
| WO | WO 2004/095597 | 11/2004 |

OTHER PUBLICATIONS

Office Action dated Jul. 17, 2009 for corresponding application CN 2008101319108.

Notice of Allowance for corresponding Korean Application No. 10-2007-0064293.

Office Action for corresponding Korean Patent Application No. 10-2007-0064293.

Extended European Search Report dated Feb. 8, 2011 for corresponding EP Application No. 08252229.3.

Office Action dated May 31, 2011 in corresponding Japanese Patent Application No. 2007-263288.

Decision of Grant concerning Japanese Application No. 2007-263288.

* cited by examiner

LIGHT EMITTING DISPLAY AND METHOD OF MANUFACTURING THE SAME

CROSS-REFERENCE TO RELATED APPLICATIONS

This application is a continuation-in-part of U.S. application Ser. No. 12/215,610 filed Jun. 27, 2008 which claims the benefit of Korean Patent Application No. 10-2007-0064293 filed Jun. 28, 2007 in the Korean Intellectual Property Office, the entire contents of which are incorporated by reference herein. This application also claims the benefit of Korean Patent Application No. 10-2008-0106221, filed on Oct. 29, 2008, in the Korean Intellectual Property Office, the entire content of which is incorporated herein by reference.

BACKGROUND

1. Field of the Invention

The present invention relates to a light emitting display and a method of manufacturing the same, and more particularly to, a light emitting display having an inert liquid filling material between a substrate on which a light emitting device is formed and a sealing substrate, and a method of manufacturing the same.

2. Discussion of Related Art

Since a light emitting device such as an organic light emitting diode (OLED) includes organic materials vulnerable to moisture or oxygen, it is desirable to protect the OLED against moisture and/or oxygen using a sealing member.

Since a light emitting display using an OLED typically has a wide viewing angle, high contrast and response speed, and low power consumption, in spite of its vulnerability to moisture or oxygen, light emitting displays are widely used in personal portable apparatuses, such as MP3 players, mobile telephones, and televisions (TV). The thicknesses of light emitting displays have been gradually reduced in accordance with the requests of users.

However, when the thickness of a substrate of a light emitting display is reduced to no more than about 0.3 mm in order to reduce the thickness thereof, it is difficult to maintain the mechanical integrity of the device under stresses such as falling and twisting. Loss of mechanical integrity can compromise the sealed state of the device, thereby reducing the life of the organic light emitting display.

SUMMARY OF THE INVENTION

Accordingly, it is an object to provide a light emitting display capable of securing mechanical reliability and of increasing a life and a method of manufacturing the same.

It is another object to provide a light emitting display capable of securing mechanical reliability while using an inorganic sealing material that effectively prevents moisture or oxygen from penetrating and a method of manufacturing the same.

In order to achieve the foregoing and/or other objects, according to one aspect of the present invention, there is provided a light emitting display including: a first substrate on which a plurality of light emitting devices are formed; a second substrate disposed to face the first substrate; a dam member disposed between the first substrate and the second substrate to surround the plurality of light emitting devices; an inorganic sealing material disposed between the first substrate and the second substrate on an outward side of the dam member and attaching the first substrate and the second substrate; and a filling material provided between the first substrate and the second substrate on an inward side of the dam member and formed of at least one inert liquid selected from the group consisting of perfluorocarbon and fluorinert.

In order to achieve the foregoing and/or other objects, according to another aspect of the present invention, there is provided a method of manufacturing a light emitting display including: providing a first substrate on which a plurality of light emitting devices are formed; providing a second substrate; forming an inorganic sealing material along an edge of the second substrate; forming a dam member on the second substrate on an inward side of the inorganic sealing material to surround the plurality of light emitting devices; dropping a filling material to an inward side of the dam member, the filling material being formed of at least one inert liquid selected from the group consisting of perfluorocarbon and fluorinert; disposing the first substrate and the second substrate to face each other; and attaching the inorganic sealing material to the first substrate and the second substrate to seal the plurality of light emitting devices.

The present invention as described above seals an light emitting device using an inorganic sealing material which effectively blocks hydrogen or oxygen and fills a space between substrates with an inert liquid filling material to improve pressure resistance. The inert liquid filling material, such as perfluorocarbon or fluorinert, is a colorless, odorless, nontoxic and inert material, has a high stability not to react to the material of the light emitting device, and maintains pressure resistance between the substrates to allow a sealed state not to be easily broken by means of impact or the like. Therefore, mechanical reliability is improved so that the life of a light emitting display can be increased, and a passivation film for protecting a cathode electrode is omitted to simplify the manufacturing process.

Also, in a conventional light emitting display, since a space between a substrate and a sealing substrate is empty, the substrate may droop to generate Newton's ring or the display is vulnerable to impact. In the light emitting display according to the present invention, however, the space between the substrate and the sealing substrate is filled with a liquid filling material with a refractivity similar to the refractivity of a glass substrate, so that Newton's ring does not occur and visibility is high.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF PREFERRED EMBODIMENTS

Figure 1:
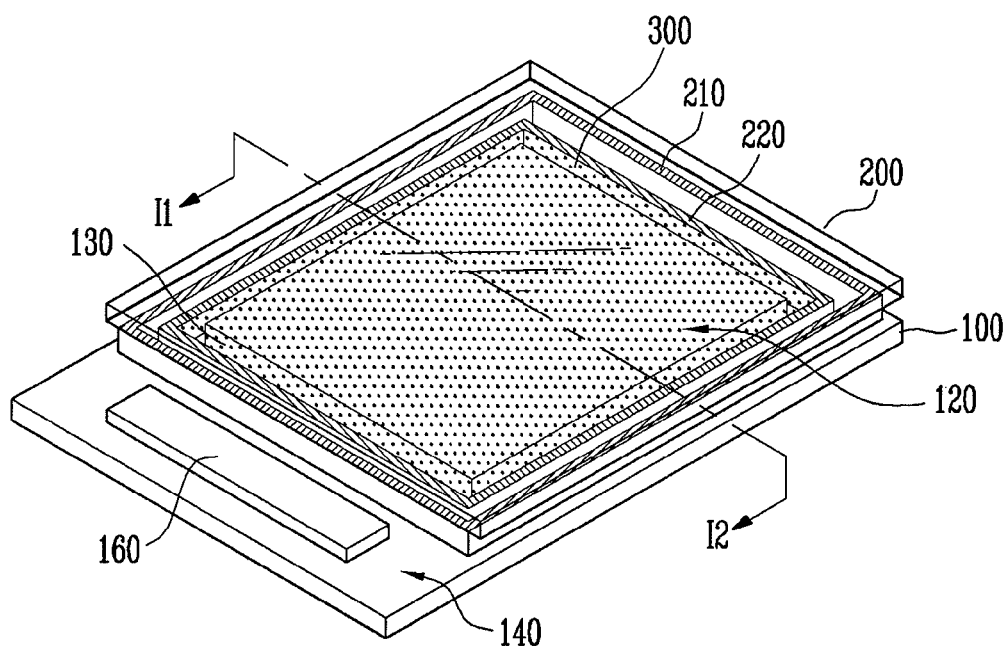
FIG. 1 is a perspective view illustrating a light emitting display according to the present invention.

Hereinafter, exemplary embodiments of the present invention will be described in detail with reference to the accompanying drawings. However, the embodiments set forth herein are provided so that those skilled in the art can fully understand the present invention and thus, the present invention can be embodied in different forms and should not be construed as limited to the embodiments set forth herein. Here, when a first element is described as being coupled to a second element, the first element may be not only directly coupled to the second element but may also be indirectly coupled to the second element via one or more third elements. Further, elements that are not essential to a complete understanding are omitted for clarity. Also, like reference numerals refer to like elements throughout.

In order to increase the life of an organic light emitting display, it is useful to employ an inorganic sealing material that effectively prevents moisture or oxygen from penetrating. However, the inorganic sealing material easily falls off by means of impact or twisting to deteriorate mechanical reliability.

Therefore, the present invention provides a light emitting display capable of increasing a life and of improving mechanical reliability using an inorganic sealing material that effectively prevents moisture or oxygen from penetrating and a method of manufacturing the same.

Figure 2:
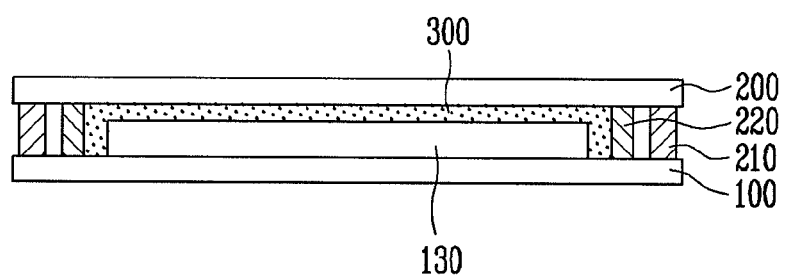
FIG. 2 is a cross-sectional view taken along section line I1-I2 of FIG. 1.

FIG. 1 is a perspective view illustrating a light emitting display according to the present invention, and FIG. 2 is a cross-sectional view taken along section line I1-I2 of FIG. 1.

Referring to FIGS. 1 and 2, the light emitting display of the present invention includes a substrate 100 on which a plurality of light emitting devices 130 are formed, a sealing substrate 200 disposed to face the substrate 100, a dam member 220 provided between the substrate 100 and the sealing substrate 200 to surrounds the plurality of light emitting devices 130, an inorganic sealing material 210 provided between the substrate 100 and the sealing substrate 200 outside the dam member 220 to attach the substrate 100 to the sealing substrate 200, and an inert liquid filling material 300 provided between the substrate 100 and the sealing substrate 200 inside the dam member 220.

The substrate 100 is defined as a pixel region 120 and a non-pixel region 140 around the pixel region 120. The plurality of light emitting devices 130 are formed in the pixel region 120, and a driving circuit 160 for driving the plurality of light emitting devices 130 is formed in the non-pixel region 140.

Figure 3:
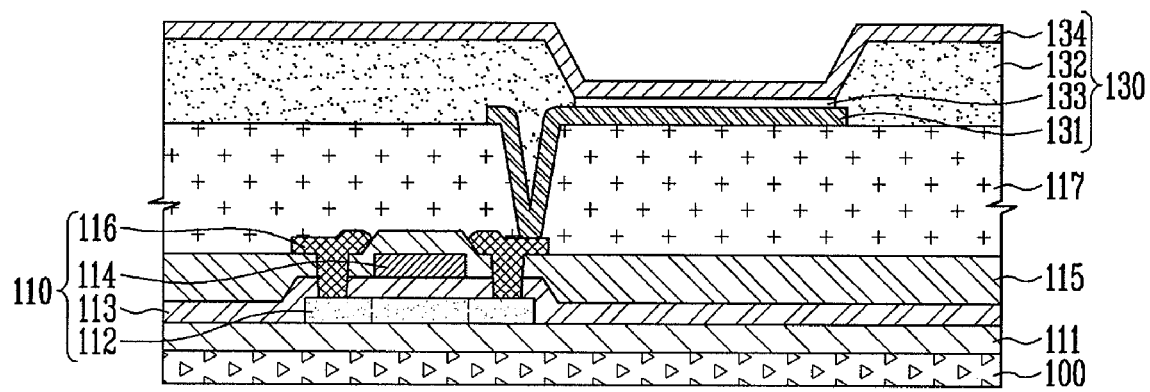
FIG. 3 is a cross-sectional view illustrating the light emitting device of FIG. 1.

Referring to FIG. 3, the light emitting devices 130, for example, may be organic light emitting diodes (OLEDs) that include anode electrodes 131, cathode electrodes 134 and organic light emitting layers 133 formed between the anode electrodes 131 and the cathode electrodes 134. The organic light emitting layers 133 are formed in a light emitting region (a region where the anode electrode 131 is exposed) defined by a pixel definition layer 132 and may include a hole injection layer, a hole transport layer, an electron transport layer and an electron injection layer.

Also, the light emitting device 130 may be coupled to a thin film transistor for controlling the operation and a capacitor for maintaining a signal. The thin film transistor 110 includes a semiconductor layer 112 providing a source and drain region and a channel region, a gate electrode 114 insulated from the semiconductor layer 112 by a gate insulating layer 113, and a source and drain electrode 116 coupled to the semiconductor layer 112 in the source and drain region through a contact hole formed in the insulating layer 115 and the gate insulating layer 113. Reference numerals 111 and 117, not explained, are a buffer layer and a planarization layer, respectively.

The sealing substrate 200 is provided to overlap with the pixel region 120 and a part of the non-pixel region 140. In the case of a front emission type, the sealing substrate 200 can be formed of a transparent material such as glass. In the case of a rear emission type, the sealing substrate 200 can be formed of an opaque material.

The inorganic sealing material 210 includes frit, which is melted by a laser or infrared rays to be attached to the substrate 100 and the sealing substrate 200. The inorganic sealing material 210 is provided between the substrate 100 and the sealing substrate 200 to surround the light emitting devices 130 so that the infiltration of moisture or oxygen from the outside is prevented.

The dam member 220 prevents the filling material 300 from flowing to keep the filling material 300 in shape. The dam member 220 is provided to prevent heat from being transmitted to the light emitting devices 130 while the inorganic sealing material 210 is attached to the substrate 100 and the sealing substrate 200. The dam member 220 is formed of an inorganic material or an organic material.

The inorganic material may employ frit. In this case, frit that transmits or reflects a laser or infrared rays is used or a reflecting layer is formed on the surface of the dam member 220 using metal having a high reflectance in an infrared region such as Au, Ag, Pt, Al, or the like so that a laser or infrared rays are reflected. In addition, the organic material may use at least one material selected from the group consisting of epoxy, epoxy acrylate, and silicones (such as bisphenol A type epoxy, cycloaliphatic epoxy resin, phenyl silicone resin or rubber, acrylic epoxy resin, and the like).

The dam member 220 may be formed to be in contact with the inorganic sealing material 210 or to be parallel separated from the inorganic sealing material 210 by a predetermined distance. For example, the dam member 220 may be in contact with the inorganic sealing material 210 when the dam member 220 includes an inorganic material, and may be separated from the inorganic sealing material 210 by 50 μm or more when the dam member 220 includes an organic material. When the dam member 220 of an organic material is formed to be in contact with the inorganic sealing material 210, the dam member 220 is thermally decomposed while the inorganic sealing material 210 is attached to the substrate 100 and the sealing substrate 200, thereby generating out gas.

The inert filling material 300 is provided to fill an inner space defined by the dam member 220, and thus it preferably employs a colorless material having a transmittance of not less than 90% in a visible region such as a glass substrate. Also, the inert filing material 300 preferably has a high stability not reacting to the material of the light emitting device 130. An inert liquid used as the filling material 300 may be selected from the group consisting of perfluorocarbon and fluorinert. The inert liquid is a colorless, odorless, nontoxic and inert material and has a high stability so that it does not react to an electrode formed of a metal material, in particular, the cathode electrode 134.

In order to protect the cathode electrode 134 after the light emitting device 130 is formed as shown in FIG. 3, an organic or inorganic passivation film (not shown) is required to be formed on the cathode electrode 134. In this case, however, a more process is involved and the thickness of the display becomes thicker. However, since the present invention uses the filling material 300 formed of an inert liquid not reacting to a metal material, it can be implemented to have a structure where the cathode electrode 134 is exposed, making it possible to simplify the process and structure thereof.

Next, a method of manufacturing a light emitting display will now be described in detail.

Figure 4A:
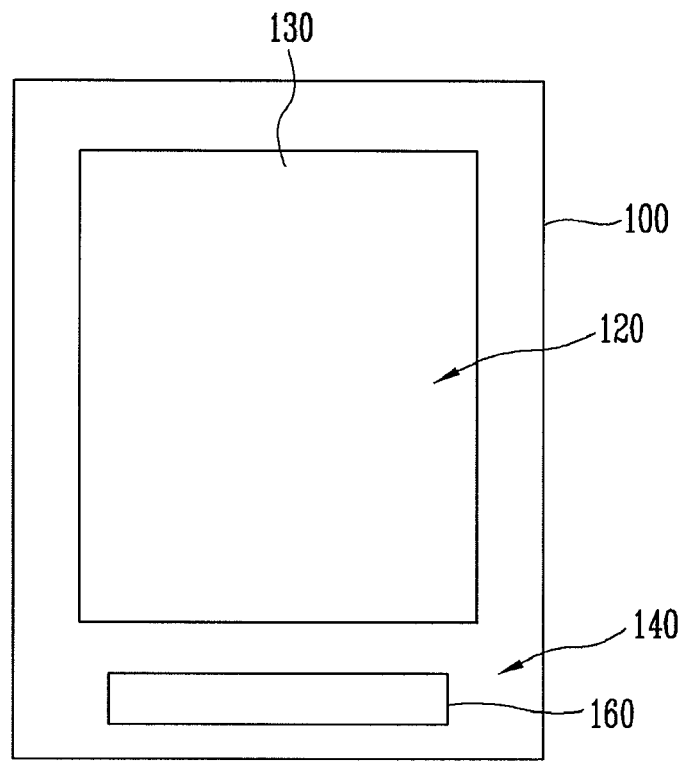
FIGS. 4A and 4B are plan views illustrating an embodiment of a method of manufacturing the light emitting display according to the present invention.
Figure 4B:
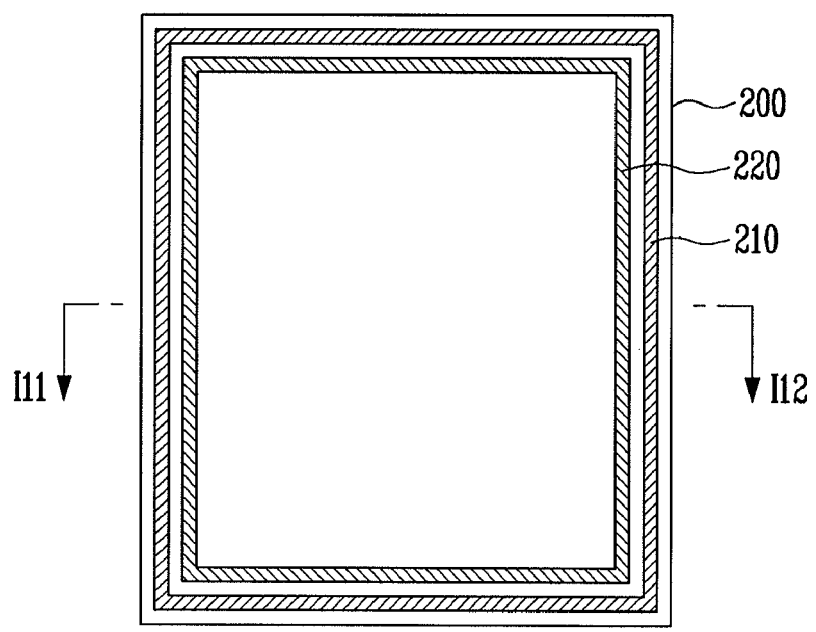

FIGS. 4A and 4B are plan views illustrating a method of manufacturing the light emitting display according to the present invention. FIGS. 5A to 5F are cross-sectional views illustrating the method of manufacturing the light emitting display according to the present invention, taken along section line I11-I12 of FIG. 4B.

Referring to FIG. 4A, first, the substrate 100 on which the plurality of light emitting devices 130 are formed is provided. The substrate 100 is divided into the pixel region 120 and the non-pixel region 140 around the pixel region 120. The plurality of light emitting devices 130 can be formed in the pixel region 120 of the substrate 100, and the driving circuit 160 for driving the light emitting devices 130 can be formed in the non-pixel region 140.

The light emitting devices 130 include the OLEDs having the anode electrodes, the organic light emitting layers, and the cathode electrodes. Also, it may further include thin film transistors (TFTs) for controlling the operation of the OLEDs and capacitors for maintaining signals. A process of manufacturing an OLED is illustrated in the Korean Patent Publications No. 2002-0047889 (published on Jun. 22, 2002) and No. 2003-0092873 (published on Dec. 6, 2003), the entire disclosures of which are incorporated by reference.

Figure 5A:
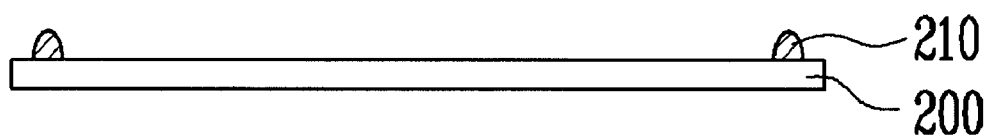
FIGS. 5A to 5F are cross-sectional views illustrating the embodiment of the method of manufacturing the light emitting display according to the present invention.

Referring to FIGS. 4B and 5A, the sealing substrate 200 for sealing the light emitting devices 130 of the pixel region 120 is provided. The sealing substrate 200 may overlap with the pixel region 120 and a part of the non-pixel region 140. The sealing substrate 200 employs a transparent substrate such as glass in case of a front emission structure or an opaque substrate in case of a rear emission type.

An inorganic sealing material 210 is formed along the edge of the sealing substrate 200. The inorganic sealing material 210 may employ frit and be formed by applying using dispensers or a screen printing method. Frit commonly means a powdery glass material. However, in the present embodiment of the invention, frit refers to paste including a main material such as SiO2 mixed with a laser or infrared ray absorbing material, an organic binder, and a filler for reducing a thermal expansion coefficient. The frit in paste is hardened, as the organic binder and moisture are removed from the frit via a drying or annealing process. The laser or infrared ray absorbing material may include a transition metal compound, for example, a vanadium compound. After the inorganic sealing material 210 is formed on the sealing substrate 200, a washing process may be performed.

Figure 5B:
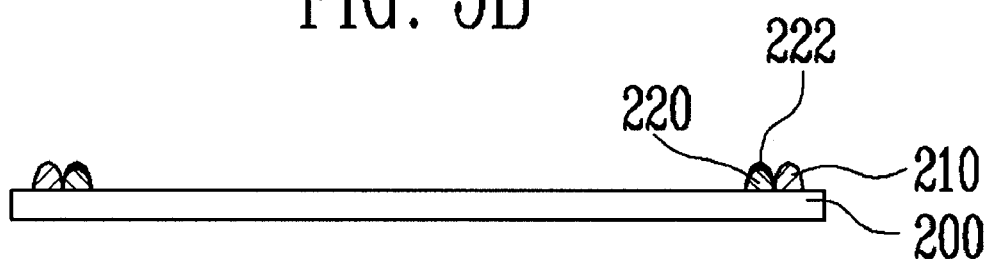
Figure 5C:
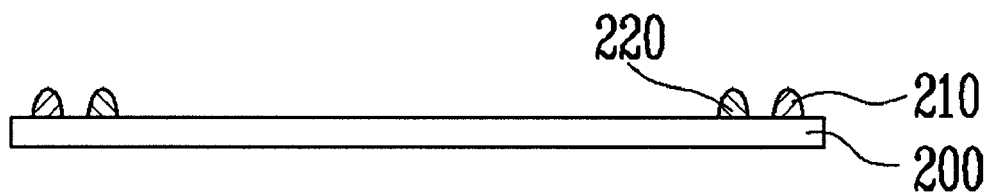

Referring to FIGS. 4B, 5B, and 5C, the dam member 220 is formed on the sealing substrate 200 on the inward side of the inorganic sealing material 210 to surround the pixel region 120. The dam member 220 may use an inorganic material or an organic material, and be applied by dispensers or screen printing. At this time, the amount of the inorganic material or organic material is determined in consideration of the distance from an outmost light emitting device 130 in the pixel region 120 to the inorganic sealing material 210 and the height of the dam member 220. The height of the dam member 220 is determined by the height of the inorganic sealing material 210 and is preferably adjusted to be equal to or lower than the height of the inorganic sealing material 210.

The inorganic material may employ frit. In this case, the dam member 220 can be formed in a process of forming the inorganic sealing material 210. Preferably, frit that transmits or reflects a laser or infrared rays is used or a reflecting layer 222 is formed on the surface of the dam member 220 in order to reflect a laser or infrared rays, as illustrated in FIG. 5B. For example, after applying the frit in paste, followed by drying or annealing, the frit is hardened to form the dam member 220. Then, metal such as Au, Ag, Pt, or Al having a high reflectance in the infrared region is applied to the surface of the dam member 220 to form the reflecting layer 222. The organic material may employ a material selected from the group consisting of epoxy, epoxy acrylate, and silicones (such as bisphenol A type epoxy, cycloaliphatic epoxy resin, phenyl silicone resin or rubber, acrylic epoxy resin, etc.).

The dam member 220 is formed to be in contact with the inorganic sealing material 210, as illustrated in FIG. 5B, or to be separated from the inorganic sealing material 210 by a predetermined distance, as illustrated in FIG. 5C. For example, when the dam member 220 is formed of an inorganic material, it is in contact with the inorganic sealing material 210. In this case, the area of the non-pixel region, i.e., a dead space, may be reduced. In addition, when being formed of an organic material, the dam member 220 is preferably separated from the inorganic sealing material 210 by no less than about 50 μm. Since the organic material typically has low viscosity to be easily applied, the dam member 220 may be easily collapsed by stress such as a pressure difference. Therefore, the dam member 220 is formed and then pre-hardened so that it becomes solid in structure to enhance its function. The dam member 220 is pre-hardened by heat, an electron beam, or an ultraviolet ray in accordance with the kind of the organic material and so as not to be damaged by stress in a process of attaching the substrate 100 to the sealing substrate 200.

In another embodiment, in a process of forming the inorganic sealing material 210 or the dam member 220, a dummy sealing material (not shown) may be formed of epoxy, frit, etc. along the outermost edge of the sealing substrate 200. The dummy sealing material is formed outside the inorganic sealing material 210 to collectively seal up the space between the substrate 100 and the sealing substrate 200. In the case of a mother substrate, the dummy sealing material is disposed on the outermost edge thereof.

Figure 5D:
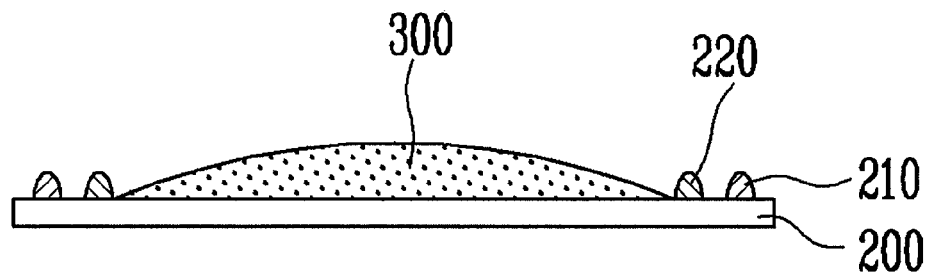

Referring to FIG. 5D, the inert liquid filling material 300 is provided on the sealing substrate 200 on the inward side of the region defined by the dam member 220. The filling material 300 is preferably a colorless material having a transmittance of not less than about 90% in a visible ray region and has stability not reacting to the material of the light emitting devices 130. An inert liquid used as the filling material 300 may be selected from the group consisting of perfluorocarbon and fluorinert.

The filling material 300 may be provided using ink jetting, dispensers, screen printing, one drop filling (ODF) or the like. For example, the proper amount of the filling material 300 can be dropped to the sealing substrate 200 on the inward side of the dam member 220 using a one drop filling (ODF) device. In this case, the proper amount of the filling material 300 in proportion to the volume of the theoretical internal space can be easily controlled.

Figure 5E:
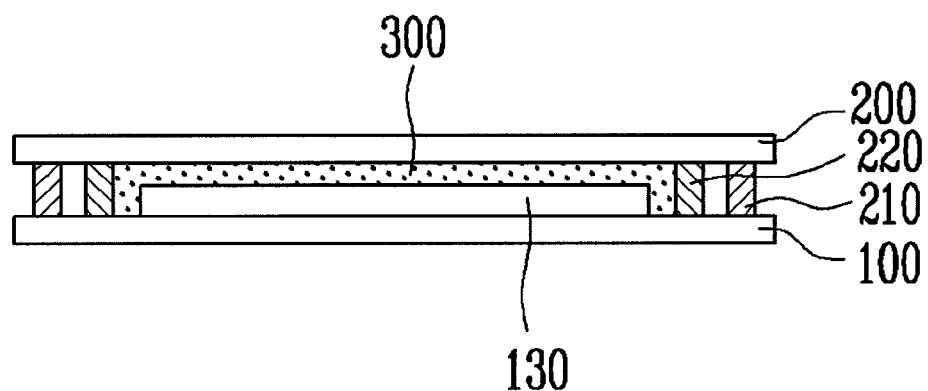

Referring to FIG. 5E, the substrate 100 is disposed to face the sealing substrate 200. For example, the substrate 100 is mounted on an upper chuck of an attaching device and the sealing substrate 200 is mounted on a lower chuck of the attaching device, and then the substrate 100 and the sealing substrate 200 are attached to each other. As the substrate 100 and the sealing substrate 200 are attached to each other, the light emitting devices 130 are covered with the filling material 300, and the flow of the filling material 300 is prevented by the dam member 220 so that the filling material is kept in shape. At this time, the substrate 100 and the sealing substrate 200 are attached to each other under a pressure lower than atmospheric pressure so as not to form bubbles or voids between the substrate 100 and the sealing substrate 200. In addition, the substrate 100 and the sealing substrate 200 are pressed together so that the space between the light emitting devices 130 and the sealing substrate 200 is completely filled with the filling material 300.

Figure 5F:
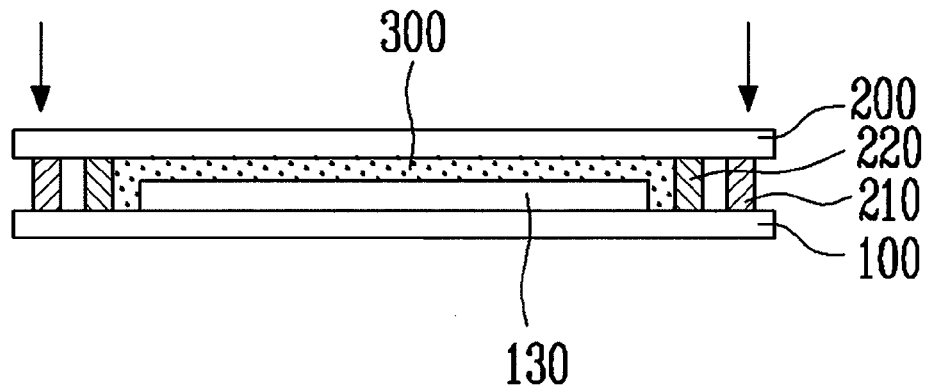

Referring to FIG. 5F, a laser or infrared rays are irradiated along the inorganic sealing material 210 while the substrate 100 and the sealing substrate 200 are attached to each other. As the laser or infrared rays are absorbed to generate heat, the inorganic sealing material 210 is melted to be attached to the substrate 100 and the sealing substrate 200, and accordingly the light emitting devices 130 are sealed. Such a sealing process is performed preferably after the dummy sealing material is hardened so that the space between the substrate 100 and the sealing substrate 200 is kept a vacuum.

When a laser or infrared rays are irradiated along the inorganic sealing material 210, a mask or a protecting film (not shown) is used to irradiate the laser and infrared rays only to a desired region. When the dam member 220 includes an inorganic material that transmits or reflects a laser or infrared rays or when the reflecting layer 222 is disposed on the surface of the dam member 220, the mask or the protecting film is disposed only in the pixel region 120 so that the laser or infrared rays are not irradiated. When the dam member 220 includes an organic material, the mask or the protecting film is disposed in the pixel region 120 and the non-pixel region 140 where the dam member 220 is formed so that the laser or infrared rays do not irradiated.

Assuming that a dam member 220 is not formed, since heat generated in the irradiation of a laser or infrared rays is easily transmitted to the filling material 300, a temperature rise may momentarily occurs to cause a damage to the light emitting devices 130. In the present invention, however, the transmission of heat is effectively reduced or prevented by the dam member 220 as well as the region filled with the filling material 300 and the shape thereof are maintained as they are.

Although the above embodiment has been described with the inorganic sealing material 210 sealing only the pixel region 120, not limited thereto, the inorganic sealing material 210 may further seal the driving circuit 160. In addition, the inorganic sealing material 210 and the dam member 220 are described as being integrated with each other on the sealing substrate 200, but may be integrated with each other on the substrate 100 and may have a double or multiple structure. For example, in order to improve sealing effect, the inorganic sealing material 210 may be formed in a double or multiple structure, or the dam member 220 may have a double or multiple structure in order to improve heat shielding effect.

In addition, in the above embodiment, the filling material 300 is filled before attaching the substrate 100 and the sealing substrate 200 to each other. However, the filling material 300 may be filled after the substrate 100 and the sealing substrate 200 are attached to each other in accordance with the properties of material.

While the present invention has been described in connection with certain exemplary embodiment, it is to be understood that the invention is not limited to the disclosed embodiment, but, on the contrary, is intended to cover various modifications and equivalent arrangements included within the spirit and scope of the appended claims, and equivalents thereof.

What is claimed is:

1. A light emitting display comprising:
   a first substrate on which a plurality of light emitting devices are formed;
   a second substrate disposed to face the first substrate;
   a dam member disposed between the first substrate and the second substrate to define an enclosed space to surround the plurality of light emitting devices, wherein a reflecting layer that reflects a laser or infrared rays is formed on a surface of the dam member;
   an inorganic sealing material disposed between the first substrate and the second substrate on an outward side of the dam member and attaching the first substrate and the second substrate wherein the inorganic sealing member defines an enclosed space and is spaced from the dam member and wherein the inorganic material comprises fit; and
   a filling material provided between the first substrate and the second substrate on an inward side of the dam member and formed of at least one inert liquid selected from the group consisting of perfluorocarbon and fluorinert.

2. The light emitting display as claimed in claim 1, wherein the light emitting devices comprise first electrodes, organic light emitting layers and second electrodes.

3. The light emitting display as claimed in claim 2, wherein the filling material is provided between the first substrate and the second substrate to be in contact with the second electrodes.

4. The light emitting display as claimed in claim 1, wherein the dam member comprises an inorganic material.

5. The light emitting display as claimed in claim 1, wherein the reflecting layer comprises at least one selected from the group consisting of Au, Ag, Pt, and Al.

6. The light emitting display as claimed in claim 1, wherein the dam member comprises an organic material.

7. The light emitting display as claimed in claim 6, wherein the organic material comprises at least one selected from the group consisting of epoxy, epoxy acrylate, bisphenol A type epoxy, cycloaliphatic epoxy resin, phenyl silicone resin or rubber, and acrylic epoxy resin.

8. The light emitting display as claimed in claim 6, wherein the dam member is disposed to be separated from the inorganic sealing material.

9. The light emitting display as claimed in claim 6, wherein the dam member and the inorganic sealing material are separated from each other by at least about 50 μm.

10. The light emitting display as claimed in claim 6, wherein the inorganic sealing material comprises frit.

11. The light emitting display as claimed in claim 10, wherein the frit is melted by a laser or infrared rays.

12. The light emitting display as claimed in claim 9, wherein the frit comprises a transition metal compound.

* * * * *

UNITED STATES PATENT AND TRADEMARK OFFICE
CERTIFICATE OF CORRECTION

PATENT NO. : 8,330,339 B2
APPLICATION NO. : 12/607863
DATED : December 11, 2012
INVENTOR(S) : Min-ho Oh et al.

It is certified that error appears in the above-identified patent and that said Letters Patent is hereby corrected as shown below:

In the Claims:

In Column 8, Line 20, (Claim 1) please change "fit;" to --frit;--.

Signed and Sealed this
Ninth Day of July, 2013

Teresa Stanek Rea
*Acting Director of the United States Patent and Trademark Office*